US007772827B2

(12) United States Patent
Evers et al.

(10) Patent No.: US 7,772,827 B2
(45) Date of Patent: Aug. 10, 2010

(54) MEASURING DEVICE, IN PARTICULAR, A VECTORIAL NETWORK ANALYZER WITH PHASE REGULATION

(75) Inventors: Christian Evers, Kirchheim (DE); Thilo Bednorz, Erding (DE); Georg Ortler, Gessertshausen (DE)

(73) Assignee: Rohde & Schwarz GmbH & Co. KG, Müchen (DE)

( * ) Notice: Subject to any disclaimer, the term of this patent is extended or adjusted under 35 U.S.C. 154(b) by 181 days.

(21) Appl. No.: 11/996,609

(22) PCT Filed: Jun. 19, 2006

(86) PCT No.: PCT/EP2006/005865
§ 371 (c)(1),
(2), (4) Date: Mar. 20, 2008

(87) PCT Pub. No.: WO2007/017001
PCT Pub. Date: Feb. 15, 2007

(65) Prior Publication Data
US 2008/0164861 A1    Jul. 10, 2008

(30) Foreign Application Priority Data
Aug. 8, 2005    (DE)    ........................ 10 2005 037 353

(51) Int. Cl.
*G01R 25/00* (2006.01)
*H03D 13/00* (2006.01)
(52) U.S. Cl. .................. 324/76.77; 324/76.74
(58) Field of Classification Search ............. 324/76.77, 324/76.11, 76.12, 76.19, 76.22, 138, 622, 324/650, 683, 709, 76.52, 76.74; 702/1, 702/72, 85, 106; 361/85, 185, 244
See application file for complete search history.

(56) References Cited

U.S. PATENT DOCUMENTS

| 5,119,399 | A |   | 6/1992  | Santos et al.              |
|-----------|---|---|---------|----------------------------|
| 5,170,126 | A | * | 12/1992 | Wedge et al. ....... 324/613 |
| 5,633,801 | A | * | 5/1997  | Bottman ............ 702/65  |
| 5,751,153 | A | * | 5/1998  | Bockelman ......... 324/638 |
| 6,590,399 | B1| * | 7/2003  | Karl et al. ......... 324/637 |
| 6,970,000 | B2| * | 11/2005 | Evers et al. ....... 324/638 |
| 2004/0066182 | A1 | | 4/2004 | Evers et al.              |
| 2004/0196051 | A1 | | 10/2004 | Dunsmore et al.           |

FOREIGN PATENT DOCUMENTS

| DE | 19750349 C2 | 5/1998 |
| DE | 10246700    | 4/2004 |
| DE | 10331092    | 2/2005 |

OTHER PUBLICATIONS

International Search Report for PCT/EP2006/005865 dated Oct. 6, 2006.

* cited by examiner

*Primary Examiner*—Hoai-An D Nguyen
(74) *Attorney, Agent, or Firm*—Marshall, Gerstein & Borun LLP

(57) ABSTRACT

A method for operating a measuring device, in particular, a vectorial network analyzer, which can be connected via at least two ports to a device under test, with excitation units assigned to each port, wherein each excitation unit provides a signal generator, with which the assigned port can be supplied with an excitation signal, provides the following procedural stages: a measurement at measuring positions of the actual phase offset between the excitation signals output at the ports; and a variation of the frequency of at least one of the two signal generators during a correction interval so that a specified set phase offset is achieved at reference positions between the excitation signals output at the ports.

8 Claims, 3 Drawing Sheets

MEASURING DEVICE, IN PARTICULAR, A VECTORIAL NETWORK ANALYZER WITH PHASE REGULATION

BACKGROUND OF THE INVENTION

1. Field of the Invention

The invention relates to a measuring device, in particular, a vectorial network analyzer.

2. Related Technology

Especially in the context of network analysis, but also with other measurement problems, a component (DUT) to be measured must be excited with a differential signal in the so-called "differential mode". In the "differential mode", there is a fixed phase difference of 180° between the two excitation signals. By contrast, in the so-called "common mode", the two ports of the device under test must be supplied with a precisely in-phase excitation signal. In practice, fixed phase relationships between the excitation signals other than 180° and 0° are conceivable and occur in practice. The measurement problem therefore generally consists in generating two excitation signals, which have precisely the same frequency and provide a fixed, non-fluctuating phase difference relative to one another.

In order to obtain a signal source for the "differential mode", US 2004/0196051 A1 proposes the use of a common syntheziser for the two excitation ports, wherein the phase differences occurring between the two ports are equalized by control signals, which are supplied to two vectorial modulators disposed directly at the outputs of the signal source. However, the vectorial modulators are relatively expensive components, and this procedure is relatively costly.

SUMMARY OF THE INVENTION

The invention therefore provides a measuring device and a corresponding method of operation for this measuring device, which, at a low-cost, provides two excitation signals with a fixed, only slightly-fluctuating phase difference. Accordingly, the invention provides a measuring device in particular, a vectorial network analyzer, which can be connected via at least two ports to a device under test, comprising:

- several excitation units assigned to each port, wherein each excitation unit provides a signal generator, with which the assigned port can be supplied with an excitation signal;
- a phase-measuring device for measuring the actual phase offset between the excitation signals at measurement positions output at the ports;
- and a control device, which varies the frequency of at least one of the two signal generators during a correction interval in such a manner that a specified set phase offset is achieved at reference positions between the excitation signals output at the ports.

The invention also provides a method for operating a measuring device, in particular, a vectorial network analyzer, which can be connected via at least two ports to a device under test, with several excitation units each assigned to a port, wherein each excitation unit provides a signal generator, with which the assigned port can be supplied with an excitation signal, comprising measuring at measuring positions the actual phase offset between the excitation signals output at the ports, and varying the frequency of at least one of the two signal generators during the correction interval, so that a specified set phase offset is achieved at reference positions between the excitation signals output at the ports.

The invention proposes the provision of a separate signal generator, which can be operated at a different frequency, for each of the two ports, at which excitation signals are to be generated with the same frequency and with a fixed, non-fluctuating phase relationship. The actual phase offset is measured at two internal measuring positions of the measuring device, for example, the network analyzer. In the event of a deviation from the set phase offset, the frequency of one or both signal generators is varied during a correction interval in such a manner that the specified set phase offset is restored.

This can be achieved in that either the frequency of the signal generator lagging in phase is increased during the correction interval, or the frequency of the other signal generator leading in phase is reduced during the correction interval. Both of these measures can also be combined with one another.

Within the practical context of measurement technology, it is important that the phase relationship between the excitation signals is observed at given reference positions, which are also referred to as a whole as the reference plane. The reference plane is typically the DUT-end of the jack connection of the measuring cable. The phase offset is actually measured between the excitation signals but at internal measuring positions of the measuring device, for example, the network analyzer. The delay time of the wave from the internal measuring position of the measuring device to the external reference position, for example, at the end of the measuring cable, is generally not exactly the same for both of the ports supplied with the excitation signal, for example, because of different lengths of the measuring cable, so that a given set phase offset between the excitation signals at the reference positions corresponds to another set phase offset at the measuring positions. However, the assignment is unambiguous and can be determined separately for each operating frequency by means of a calibration method, to be explained in detail below, and stored in a table. If a given set phase offset between the reference positions is to be achieved during subsequent operation, it is known from the table, which set phase offset must be observed between the measuring positions for this purpose. The actual phase offset at the measuring positions can then be measured and compared with the set phase offset at the measuring positions. In the case of a positive deviation, either the frequency of the leading signal generator can be reduced and/or the frequency of the lagging signal generator can be increased. The procedure is reversed in the case of a negative deviation.

The preparation of a calibration table for the differential mode, that is to say, for a desired phase offset of 180°, can be simply implemented with a multi-port network analyzer by adding the excitation signals at the reference plane using a signal combiner, and supplying the sum signal to a third port of the network analyzer, which measures the amplitude of the sum signal. In the case of a phase difference of 180°, a minimum occurs in the amplitude of the sum signal; the sum signal is completely eliminated, if the amplitudes of the two excitation signals are also equal. The amplitudes of the excitation signals can also be calibrated in this manner.

BRIEF DESCRIPTION OF THE DRAWINGS

The invention is described below with reference to the drawings on the basis of an exemplary embodiment. The drawings are as follows.

DETAILED DESCRIPTION

Figure 1:
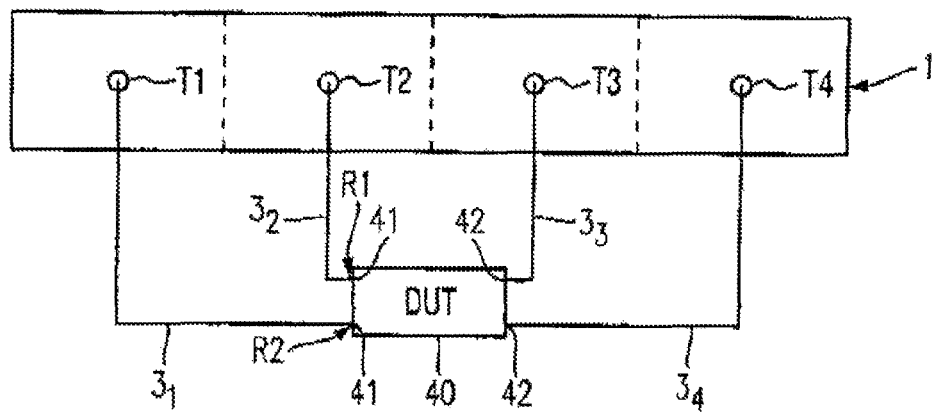
FIG. 1 shows an exemplary application of the measuring device for measuring a device under test in "differential mode"

FIG. 1 shows a measuring device 1, for example, in the form of a multi-port vectorial network analyzer, in the exemplary embodiment with four ports T1 to T4. The device tested in the exemplary measurement presented in FIG. 1 is a four-port device under test 40 with two input ports 41 and two output ports 42. The device under test is, for example, an amplifier, which amplifies a differential input signal into a differential output signal. For an exact measurement of the device under test, it is therefore necessary to apply to the reference plane, which consists of two reference positions R1 and R2, a differential excitation signal, which consists of two individual excitation signals supplied via the two ports T1 and T2 with a phase offset relative to one another of exactly 180° at the reference positions R1 and R2. The network analyzer measures the waves reflected from the device under test and transmitted by the device under test at different frequencies. Accordingly, the phase offset of 180° at the reference positions R1 and R2 must be observed not only at one frequency but at all of the operating frequencies of the network analyzer 1. In order to guarantee this, a calibration must be implemented as described below.

Figure 2:
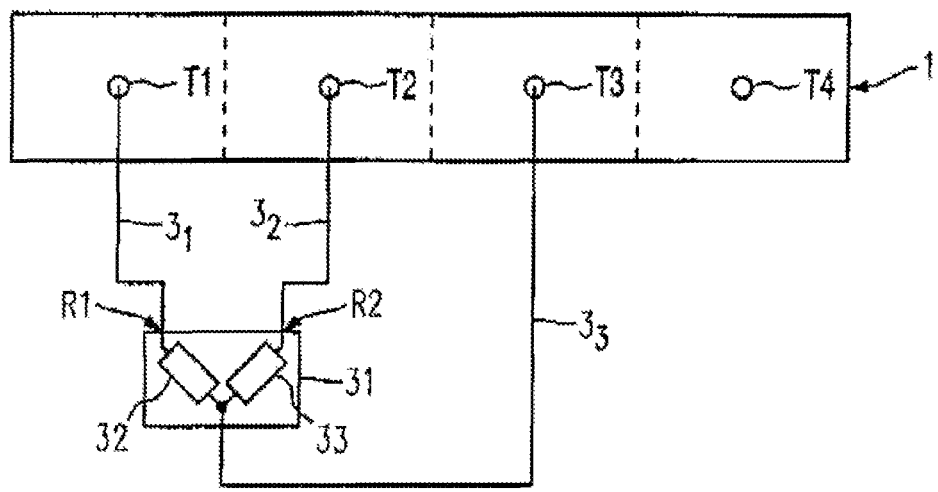
FIG. 2 shows a first configuration for calibration of the measuring device according to the invention.

FIG. 2 shows a first configuration for the calibration of the network analyzer 1. In this context, the excitation signals at the reference positions R1 and R2, which are connected to the ports T1 and T2 via the measuring cables $3_1$ or $3_2$, are combined in a signal combiner 31, preferably a resistive signal combiner having resistive elements 32, 33, to form a sum signal, which is supplied to the third port T3 of the network analyzer 1.

Figure 3:
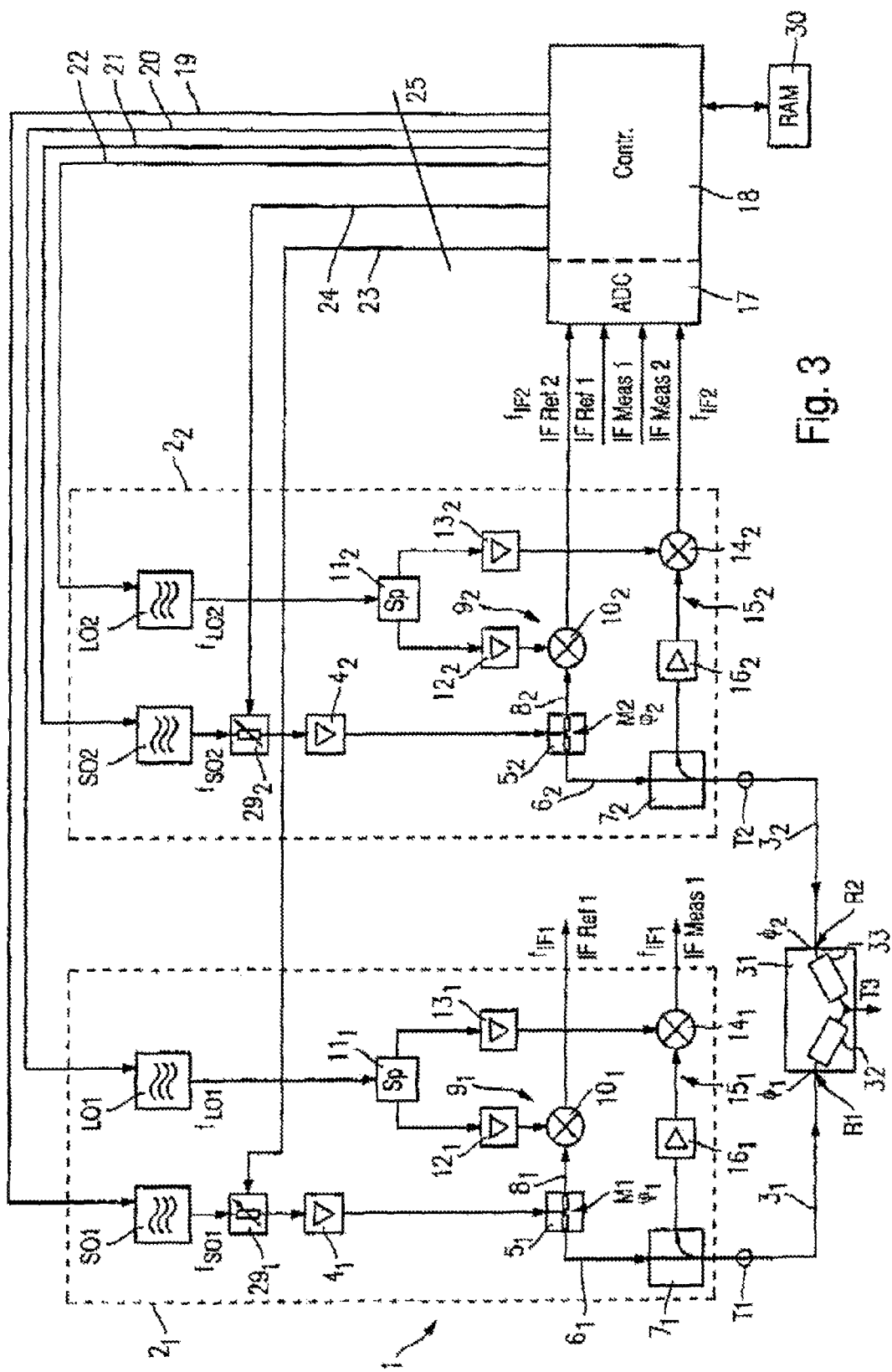
FIG. 3 shows a detailed exemplary embodiment of a network analyzer in the configuration for calibration illustrated in FIG. 2.

FIG. 3 shows the internal structure of the network analyzer 1 presenting only the excitation/reception units $2_1$ or $2_2$ of the two ports T1 and T2. Corresponding excitation/reception units are provided for the ports T3 and T4.

In the exemplary embodiment presented in FIG. 3, a separate excitation/reception unit $2_1$ or $2_2$ is provided at each port T1, T2, T3 and T4 of the measuring device 1. Each excitation/reception unit $2_1$ or $2_2$ provides a separate signal generator SO1 and SO2, with which the device under test can be supplied with an excitation signal.

For the exemplary measurement presented in FIG. 1, each of the two differential input ports of the device under test is connected via a measurement line $3_1$ or $3_2$ to the two ports T1 and T2 of the measuring device 1, while each of the two differential output ports 42 of the device under test is connected via a measurement line $3_3$ or $3_4$ to one of the two ports T3 and respectively T4 of the measuring device 1. FIG. 3 does not show the measurement configuration, but rather the calibration configuration of FIG. 2. However, the following description also applies with regard to the measurement configuration with the device under test DUT.

The signal generators SO1 and SO2 are connected respectively via a variable attenuation element $29_1$ or $29_2$ and an amplifier $4_1$ or $4_2$ to a signal splitter $5_1$ or $5_2$. A signal branch $6_1$ or $6_2$ is connected respectively via a directional coupler $7_1$ or $7_2$ to the assigned port T1 and T2. The other branch $8_1$ or $8_2$ is connected to a mixer $10_1$ or $10_2$ of a first reception device $9_1$ or $9_2$ of the respective excitation/reception unit $2_1$ or $2_2$. The first reception device $9_1$ or $9_2$ therefore receives the excitation signal, when the associated signal generator SO1 and SO2 is active. Furthermore, an oscillator signal, which is generated in the exemplary embodiment by an internal oscillator LO1 and LO2 of the respective excitation/reception unit $2_1$ or $2_2$, is supplied to the mixer $10_1$ or $10_2$, and supplied via a signal splitter $11_1$ or $11_2$ and respectively an amplifier $12_1$ or $12_2$ to the mixer $10_1$ or $10_2$.

In the exemplary embodiment, the same oscillator LO1 and LO2 supplies a mixer $14_1$ or $14_2$ of a second reception device $15_1$ or $15_2$ of the respective excitation/reception unit $2_1$ or $2_2$ via the other signal branch of the signal splitter $11_1$ or $11_2$ and a corresponding amplifier $13_1$ or $13_2$. The mixer $14_1$ or $14_2$ is connected via an isolation amplifier $16_1$ or $16_2$ and the directional coupler $7_1$ or $7_2$ to the assigned port T1 or respectively T2. Accordingly, the second reception device $15_1$ receives the signal received from the associated port T1, reflected from the device under test to the port T1 or transmitted by the device under test from the port T1 to the port T2. Correspondingly, the second reception device $15_2$ of the excitation/reception unit $2_2$ receives the signal reflected from the device under test to the port T2 or transmitted by the device under test from the port T1 to the port T2. The mixers $10_1$ and $14_1$ of the first excitation/reception unit $2_1$ convert the received signal into a first intermediate-frequency position with the intermediate frequency $f_{IF1}$, while the mixers $10_2$ and $14_2$ of the second excitation/reception unit $2_2$ convert the received signal into a second intermediate-frequency position with the intermediate frequency $f_{IF2}$. In this context, the intermediate frequencies $f_{IF1}$ and $f_{IF2}$ are not necessarily identical.

The intermediate-frequency reference signal IF Ref 1 or IF Ref 2 generated by the mixers $10_1$ or $10_2$ and the intermediate-frequency measurement signal IF Meas 1 or IF Meas 2 generated by the mixers $14_1$ or $14_2$ are supplied to an analog/digital converter 17, which is connected to a signal evaluation and control unit 18. An evaluation of the reference signals and the measured signals is implemented in this unit. Furthermore, the signal evaluation and control unit 18 controls the signal generators SO1 and SO2 and the oscillators LO1 and LO2 via the control lines 19, 20, 21 and 22 in such a manner that they generate a signal with a predetermined frequency $f_{SO1}$, $f_{LO1}$, $f_{SO2}$ and respectively $f_{LO2}$.

The evaluation and control unit 18 is connected via further control lines 23 and 24 to the adjustable attenuation elements $29_1$ and $29_2$, so that the signal amplitude of the excitation signal generated by the signal generators SO1 and SO2 can be controlled. Since the actual amplitudes of the excitation signal are registered via the intermediate-frequency reference signals IF Ref 1 and IF Ref 2, a phase-locked loop can be formed in this manner for the accurate control of the excitation amplitude.

The control lines 19 to 23 can be combined in a bus system 25, in particular, a LAN bus system.

It must once again be emphasised, that the further development according to the invention relates not only to a network analyzer as presented in FIG. 3 but is also relevant in other measuring devices.

In the "differential mode", it is important that a defined phase offset of $\Delta\phi=\phi_1-\phi_2=180°$ is observed at the end of the measuring cable $3_1$ or $3_2$, that is to say, at the reference positions R1 and R2. With other applications, a different phase offset must be observed. For example, in the "common mode", co-phasality must be ensured ($\Delta\phi=0°$). However, the phase difference is measured at the measuring positions M1 and M2 in the interior of the network analyzer, for example, at the signal splitters $5_1$ or $5_2$. The phases measured at that position are indicated in FIG. 3 as $\phi_1$ and $\phi_2$, so that an actual phase difference of $\Delta\phi_{ist}$ is measured there.

Because of different propagation rates of the wave in the measuring cables $3_1$ or $3_2$, for example, as a result of the non-identical length of the measuring cable, different dielectric constants in the measuring cable and also because of slight differences in the delay times of the waves within the two excitation/reception units $2_1$ or $2_2$ caused by manufacturing fluctuations, a set phase difference $\Delta\phi=\phi_1-\phi_2$ different from the set phase difference $\Delta\phi$ between the reference positions R1 and R2 is obtained at the measuring positions M1 and M2. Accordingly, a given phase difference $\Delta\phi$ between the measuring positions M1 and M2 must be ensured, in order to generate the desired phase difference $\Delta\phi$ at the reference positions R1 and R2. This relationship between the set phase difference $\Delta\phi$ at the reference positions R1 and R2 and the associated set phase difference $\Delta\phi$ at the measuring positions M1 and M2 can be determined by calibration and stored in a memory 30.

In this context, it is not sufficient to calibrate the set phase difference $\Delta\phi$ at the measuring positions M1 and M2 only for one frequency, but rather, the deviation of the set phase difference $\Delta\phi$ at the measuring positions M1 and M2 from the set phase difference $\Delta\phi$ at the reference positions R1 and R2 is frequency dependent because of the dispersion, for example, of the measuring cable $3_1$ or $3_2$. The calibration must therefore be implemented for a plurality of frequency values, ideally for every frequency point, which can be controlled by the network analyzer, and the result must be tabulated in the table stored in the memory 30.

If the measuring device 1 is a network analyzer, the calibration can be implemented in the manner presented in FIGS. 2 and 3. For this purpose, the two measuring cables $3_1$ or $3_2$ of the first port T1 and of the second port T2 are connected via a preferably resistive coupler $3_1$ to a third measuring cable $3_3$, which is connected to a third port T3 of the network analyzer. The amplitude of the sum signal, which is obtained by summation of the excitation signals at the reference positions R1 and R2, is measured at the third port T3. If the amplitudes of the two excitation signals at the ports T1 and T2 are identical, a complete elimination of the sum signal occurs with an exact phase opposition, that is to say, with a phase offset of exactly 180°. If the amplitudes are not of the same magnitude, then at least a clear minimum will occur in the case of a phase opposition of 180°. If the amplitude of the sum signal is detected at the third port T3, it can readily be established, when an exact phase opposition is present.

If a phase offset different from 180° is to be set at the reference positions R1 and R2, a phase offset deviating by the same amount must be maintained at the measuring positions M1 and M2. For example, if a phase offset of 182° between the measuring positions M1 and M2 is required in order to achieve a 180° phase opposition at the reference positions R1 and R2, a phase offset of 2° between the measuring positions M1 and M2 must be maintained in order to achieve co-phasality, that is to say, a phase offset of 0°, between the reference positions R1 and R2. The values calibrated for the phase opposition can therefore also be transferred to other phase-offset specifications.

Figure 4:
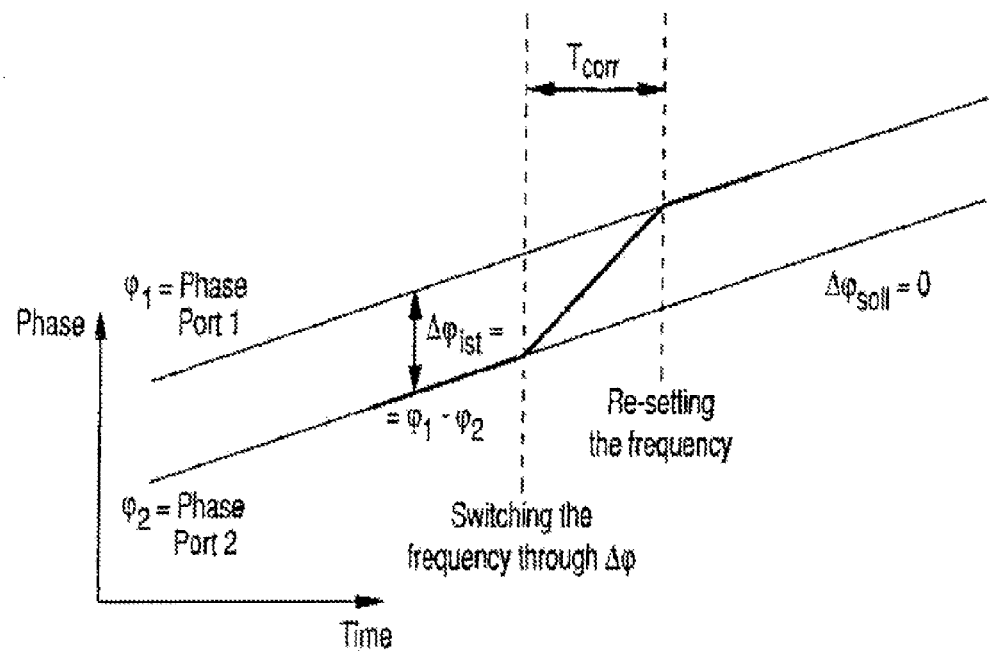
FIG. 4 shows a diagram by way of explanation of the method of operation of the measuring device according to the invention.

By way of difference from the prior art, where a common syntheziser is used to generate the excitation signals of the "differential mode" at the ports T1 and T2, and a vectorial modulator is used to achieve the phase offset at each port, each excitation/reception unit $2_1$ or $2_2$ is fitted, according to the invention, with its own excitation oscillator SO1 and SO2, which can be adjusted independently with reference to its frequency. The vectorial modulator or other adjustable phase-displacement element can then be dispensed with, if the procedure according to the invention, as illustrated in FIG. 4 and described below, is adopted.

The signal generators SO1 and SO2 are preferably high-precision syntheziser s using YIG oscillators, which generate two high-precision, identical frequencies for the operating mode "differential mode" or "common mode". Under some circumstances, a set phase position can in fact be preset. However, because of the phase control in the phase-locked loop (PLL), the current phase position is constantly subjected to fluctuations, so that the pre-selected phase difference could not be observed in the long term without the measure according to the invention. According to the invention, the actual phase offset between the measuring positions M1 and M2 is measured continuously by means of the reception devices $9_1$ or $9_2$, which, together with the analog/digital converter 17, act as a phase-measuring device. In the control device 18, the actual phase offset $\Delta\phi_{ist}$ determined in this manner at the measuring positions M1 and M2 is compared with the set phase offset $\square\square_{soll}$ at the measuring positions M1 and M2 stored in the memory 30 for the current operating frequency, which is used in order to achieve a given set phase offset $\Delta\phi$ at the reference positions R1 and R2.

If the measured actual phase offset $\Delta\phi_{ist}$ is greater than the tabulated set phase offset $\Delta\phi_{soll}$ at the measuring positions M1 and M2, the procedure is as follows:

either the frequency of the leading oscillator, for example, the oscillator SO1, is reduced for a short time during the correction interval $T_{corr}$, or the frequency of the lagging signal generator, for example, the signal generator SO1, is increased during the correction interval $T_{corr}$, so that the specified set phase offset between the measuring positions M1 and M2 is restored ($\Delta\phi_{ist}=\Delta\phi_{soll}$) after the correction interval $T_{corr}$. Before and after the correction interval, the two signal generators SO1 and SO2 are operated with exactly the same frequency. The deviation defined between the two frequencies occurs exclusively during the correction interval $T_{corr}$. Of course, both measures, that is to say, the increase of the frequency of the lagging signal generator and also the reduction of the frequency of the leading signal generator can be combined with one another in order to increase the correction rate.

If the measured actual phase offset $\Delta\phi_{ist}$ is less than the set phase offset $\Delta\phi_{soll}$ between measuring positions M1 and M2 stored in the table of the memory 30, the procedure is reversed; that is to say, the frequency of the leading signal generator during the correction interval is increased and/or the frequency of the lagging signal generator is reduced during the correction interval.

The procedure described above is illustrated in FIG. 4, wherein, in order to increase the clarity of illustration with this example, it is assumed that the required set phase offset $\Delta\phi_{soll}$ between the measuring positions M1 and M2 is 0°. The diagram shows that before testing the phase correction during the correction interval $T_{corr}$, a deviation of the measured actual phase offset $\Delta\phi_{ist}$ from the required set phase offset $\Delta\phi_{soll}=0°$ is present. That is to say, although it is required, that no phase deviation is present at the measuring positions M1 and M2, the phase $\phi_1$ of the signal generator SO1 measured at the measuring position is somewhat greater than the phase $\phi_2$ of the signal generator SO2 measured at the measuring position M2.

After the control unit 18 has established this fact, in the example illustrated in FIG. 4, it increases the frequency $f_{SO2}$ of the signal generator SO2 for a short time during the correction interval $T_{corr}$. As a result, the phase of the lagging signal generator SO2 is continuously increased, until, cophasality is restored at the end of the correction interval $T_{corr}$. When this co-phasality has been measured by the phase-measuring device $9_1$, $9_2$, 17, the control unit 18 stops increasing the frequency of the signal generator SO2 so that both signal generators SO1 and SO2 are again operated at exactly the same frequency. The phase deviation continues to be monitored. If a phase deviation, which is larger than a specified threshold value, occurs again, the control measure described above is repeated.

With regard to the measure of increasing the frequency during the correction interval $T_{corr}$, a compromise must be achieved between a rapid correction time and a high-precision adjustment. In this context, it is also possible to proceed stepwise, that is to say, in the case of large phase deviations, a large frequency deviation is initially used, which is then reduced stepwise, dependent upon the approach of the measured actual phase offset $\Delta\phi_{ist}$ towards the required set phase offset $\Delta\phi_{soll}$. An iterative procedure is also possible, that is to say, during a first correction interval, a coarse correction is implemented, and the remaining difference between the newly-measured actual phase offset and the required set phase offset is adjusted in a subsequent fine correction, in which a smaller frequency deviation between the signal generators is selected. In this context, it is, of course, also possible to proceed with more than two iterative steps.

Figure 5:
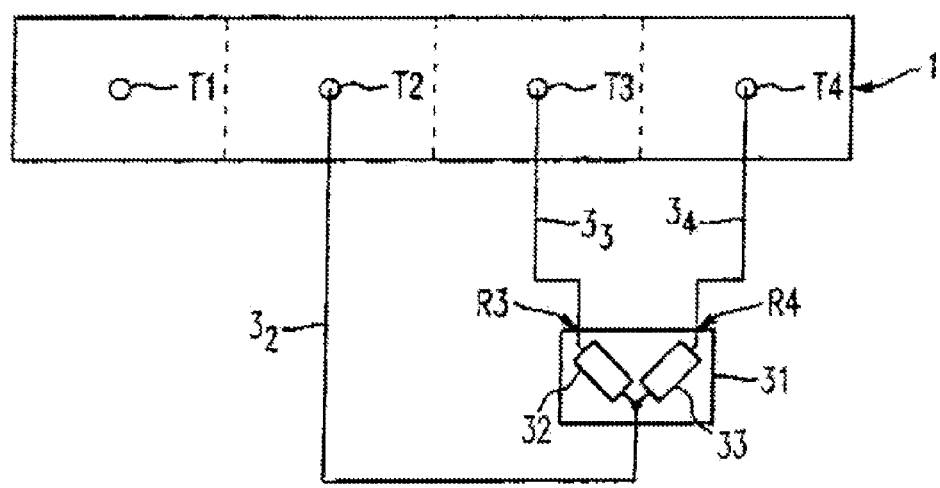
FIG. 5 shows the measuring device according to the invention in a second configuration for calibration.

After the first differential port pair, consisting of the ports T1 and T2 has been calibrated, the other differential port pairs of the network analyzer must be calibrated in the same manner. This is illustrated in FIG. 5 for the second differential port pair, consisting of the ports T3 and T4. By analogy with FIG. 2, the ports T3 and T4 are connected respectively via a measuring cable $3_3$ or $3_4$ to the signal combiner 31, which generates the sum signal of the excitation signals of the ports'sT3'sand'sT4'sand supplies these via the measuring cable $3_2$, for example, to the second port T2 of the network analyzer. The phase opposition of the signals generated from the ports T3 and T4 at the reference positions R3 and R4 is also present here on reaching a minimum of the amplitude of the sum signal or an elimination of the sum signal. After all of the differential port pairs, in the exemplary embodiment T1 and T2, on the one hand, and T3 and T4, on the other hand, have been calibrated, the first differential port pair T1 and T2 can be connected to the input ports 41 of the device under test 40, and the other port pair T3 and T4 can be connected to the output ports 42 of the device under test, as illustrated in FIG. 1, and the testing of the device under test can be started.

The invention is not restricted to the exemplary embodiment presented. For example, the calibration can also be implemented in another manner, for example, by a power measurement, wherein a power minimum occurs in the summated signal upon reaching the phase opposition. Moreover, it is advantageous to match the amplitudes to one another during the calibration by varying the amplitude of one of the two excitation signals after reaching the phase opposition, for example, by controlling the adjustable attenuation element $29_1$, or $29_2$ until the elimination of the sum signal occurs.

The invention can, of course, be used not only for different mode-adjustment options between two measuring ports, but also between all measuring ports of any multi-channel system for any stimulus signals provided, in particular, for measurements of phased-array modules, in which an excitation with symmetrical signals is not as important as the bundling or interactions for given amplitude and phase relationships.

The invention claimed is:

1. Measuring device which can be connected via at least two ports to a device under test, comprising:
    several excitation units assigned to each port, wherein each excitation unit provides a signal generator, with which the assigned port can be supplied with an excitation signal having a frequency;
    a phase-measuring device for measuring the actual phase offset between the excitation signals at measurement positions output at the ports;
    a control device, which varies the frequency of at least one of the two signal generators during a correction interval in such a manner that a specified set phase offset is achieved at reference positions between the excitation signals output at the ports; and
    a memory device, in which a table is stored with one set phase offset at each of the measuring positions related to a set phase offset at the reference positions between the signals output at the ports for each of several frequencies;
    wherein the control device registers a deviation of the actual phase offset measured at a given frequency at the measuring positions from the set phase offset at the measuring positions stored in the memory device and increases the frequency of the signal generator lagging in phase during the correction interval and/or reduces the frequency of the signal generator leading in phase during the correction interval, if the actual phase offset is greater than the set phase offset, or respectively reduces the frequency of the signal generator lagging in phase during the correction interval and/or increases the frequency of the signal generator leading in phase during the correction interval, if the actual phase offset is less than the set phase offset, and
    wherein a large phase offset is measured, a large frequency deviation is initially used which is then reduced stepwise.

2. Measuring device according to claim 1 wherein the measuring device is a multi-port network analyzer with at least three ports, and a differential excitation signal is generated between a first port and a second port, wherein a set phase offset of 180° at the reference positions exists between the excitation signals of these ports.

3. Measuring device according to claim 2, wherein in order to provide the table, the reference positions of the first port and of the second port are connected via a signal combiner to the third port, wherein the control unit detects the reaching of the set phase offset of 180° from the presence of an elimination or a minimum of the amplitude of the signal measured at the third port.

4. Measuring device according to claim 3, wherein the control device additionally sets the amplitudes of the excitation signals at the first port and/or at the second port by controlling attenuation elements in such a manner that an elimination of the signal detected at the third port is present.

5. Method for operating a measuring device, which can be connected via at least two ports to a device under test, with several excitation units each assigned to a port, wherein each excitation unit provides a signal generator, with which the assigned port can be supplied with an excitation signal, comprising:
    measuring at measuring positions the actual phase offset between the excitation signals output at the ports;
    varying the frequency of at least one of the two signal generators during the correction interval, so that a specified set phase offset is achieved at reference positions between the excitation signals output at the ports;

storing a table with one set phase offset at each of the measuring positions related to a set phase offset at the reference positions between the excitation signals output at the ports for each of several frequencies;

registering a deviation of the actual phase offset measured at a given frequency at the measuring positions from the stored set phase offset at the measuring positions; and increasing the frequency of the signal generator lagging in phase during the correction interval and/or reducing the frequency of the signal generator leading in phase during the correction time interval, if the actual phase offset is greater than the set phase offset, and/or reducing the frequency of the signal generator lagging in phase during the correction interval and/or increasing the frequency of the signal generator leading in phase during the correction interval, if the actual phase offset is less than the set phase offset, whereby measuring a large phase offset, a large frequency deviation is initially used which is then reduced stepwise.

6. Method according to claim 5, wherein the measuring device is a multi-port network analyzer with at least three ports, and a differential excitation signal is generated between a first port, wherein a set phase offset of 180° at the reference positions exists between the excitation signals of these ports.

7. Method according to claim 6, further comprising:

connecting the reference positions of the first port and of the second port via a signal combiner to the third port; and detecting reaching the set phase offset of 180° from the presence of an elimination or a minimum of the amplitude of the signal detected at the third port.

8. Method according to claim 7, further comprising:

setting the amplitude of the excitation signals at the first port and/or at the second port in such a manner that an elimination of the signal detected at the third port is present.

* * * * *